United States Patent [19]

Fok et al.

[11] 4,078,302
[45] Mar. 14, 1978

[54] MODULE BOARD ASSEMBLY FIXTURE

[75] Inventors: Raymond Fok, Rancho Palos Verdes; Gerald L. Wolfe, North Hollywood, both of Calif.

[73] Assignee: Wangco Incorporated, Los Angeles, Calif.

[21] Appl. No.: 739,622

[22] Filed: Nov. 8, 1976

[51] Int. Cl.² .............................................. H05K 3/30
[52] U.S. Cl. ..................................... 29/741; 29/281.5; 29/760; 269/236; 269/303; 269/321 WE
[58] Field of Search ................. 29/739, 740, 741, 760, 29/720, 721, 281.5; 269/321 WE, 236, 303, 157

[56] References Cited

U.S. PATENT DOCUMENTS

| 1,297,539 | 3/1919 | Bull | 269/236 X |
|---|---|---|---|
| 2,421,200 | 5/1947 | Hall | 269/236 X |
| 2,835,156 | 5/1958 | Eklund | 269/303 X |
| 3,624,676 | 11/1971 | Whitney et al. | 29/760 X |
| 3,932,931 | 1/1976 | Wright | 29/739 X |
| 3,939,542 | 2/1976 | Reggi | 29/739 X |

Primary Examiner—Carl E. Hall
Attorney, Agent, or Firm—Henry M. Bissell

[57] ABSTRACT

A module board assembly fixture capable of securing a module board in a fixed orientation in an X-Y Cartesian coordinate plane, having a quickly operated clamp capable of movement relative to a component inserter is described. The clamp is movable in both the transverse and the longitudinal directions without disorientation, and is constructed having unique module board supporting structure so that the Cartesian orientation is not disturbed by the insertion.

7 Claims, 4 Drawing Figures

MODULE BOARD ASSEMBLY FIXTURE

BACKGROUND OF THE INVENTION

1. Field of the invention

This invention relates to module board locating machines, and more particularly to apparatus movable over a work area of component inserting machines.

2. Description of the Prior Art

In the manufacture and assembly of module and similar type printed circuit or printed wire boards, the insertion or assembly of a particular component to the module board is frequently repetitive. At a particular station along an assembly process, an operator frequently is required to insert more than one electrical component onto the module board. These boards are frequently quite small, to achieve economy of space and weight. Similarly, the electrical components are small. It is extremely important that the electrical component be inserted into the module board at a precise location and at a precise orientation so that its prongs or electrical connectors will connect properly within the circuit on the board.

It is customary in the assembly of module boards to use an electrical component inserter. Such a machine normally has a chute having forced air flow therethrough. The electrical component is delivered through a nozzle at one end of the chute onto a module or printed circuit board. The electrical component frequently is a module such as a dual in-line package module (DIP), a transistor-transistor logic module (TTL) or a diode-transistor logic module (DTL) or the like. Such modules frequently have prongs or what appear to be legs which constitute the electrical connector of the circuit within the module for connection to the circuitry provided on the board. Such inserter machines are fairly reliable, and deliver the component in a fairly reliable orientation with some degree of force. Some inserter machines can be programmed to deliver a variety of predetermined or preselected different types of modules, such as DIPs, TTLs and the like. In such circumstances, a module board is located or positioned underneath the inserter machine chute for the reception of one module, then is repositioned to receive a second module, and so forth. After the assembly of the desired modules at this particular assembly station, the module board is passed to the next assembly station.

It is not unknown that toward the end of a work shift the operator becomes tired, and the precision with which the module board is located relative to the component inserter decreases, oftentimes critically. Thus, it is continually desired to obtain machines and implements which reduce assembler fatigue while aiding the assembler to maintain location precision even after long hours of tedious work.

SUMMARY OF THE INVENTION

In brief, in accordance with one aspect of the invention, an automatic inserting machine is positioned above a module board location assembly including a clamp which quickly and accurately positions a module board in the X-Y Cartesian coordinate system relative to a component inserter. The clamp is movable freely in the X and Y coordinate directions, sometimes referred to herein as, correspondingly, the transverse and longitudinal directions.

The clamp has an eccentric cam for forcing a clamping plate against spring bias toward a base plate and is mounted to move on ball bushings freely in the transverse direction on a guide rail. The guide rail is positioned perpendicular to, and mounted by ball bushings on, parallel guide rails for movement in the longitudinal direction. Indexing means, such as a light beam having a crossed hair shadow, aids in the visual location of the module board relative to the inserting machine. The clamp assembly includes extension support rods for maintaining the module board in the desired plane of movement. Handle and stop means are provided for manipulating the cam clamp. The clamp assembly further includes dowel stop pins transversely aligned to facilitate expedient alignment of the module board. Biasing means, against which the cam clamp moves, provides a releasing force to facilitate the placement and removal of the module board.

BRIEF DESCRIPTION OF THE DRAWINGS

A better understanding of the present invention may be had from a consideration of the following detailed description, taken in conjunction with the accompanying drawings, in which.

DESCRIPTION OF THE PREFERRED EMBODIMENT

Figure 1:
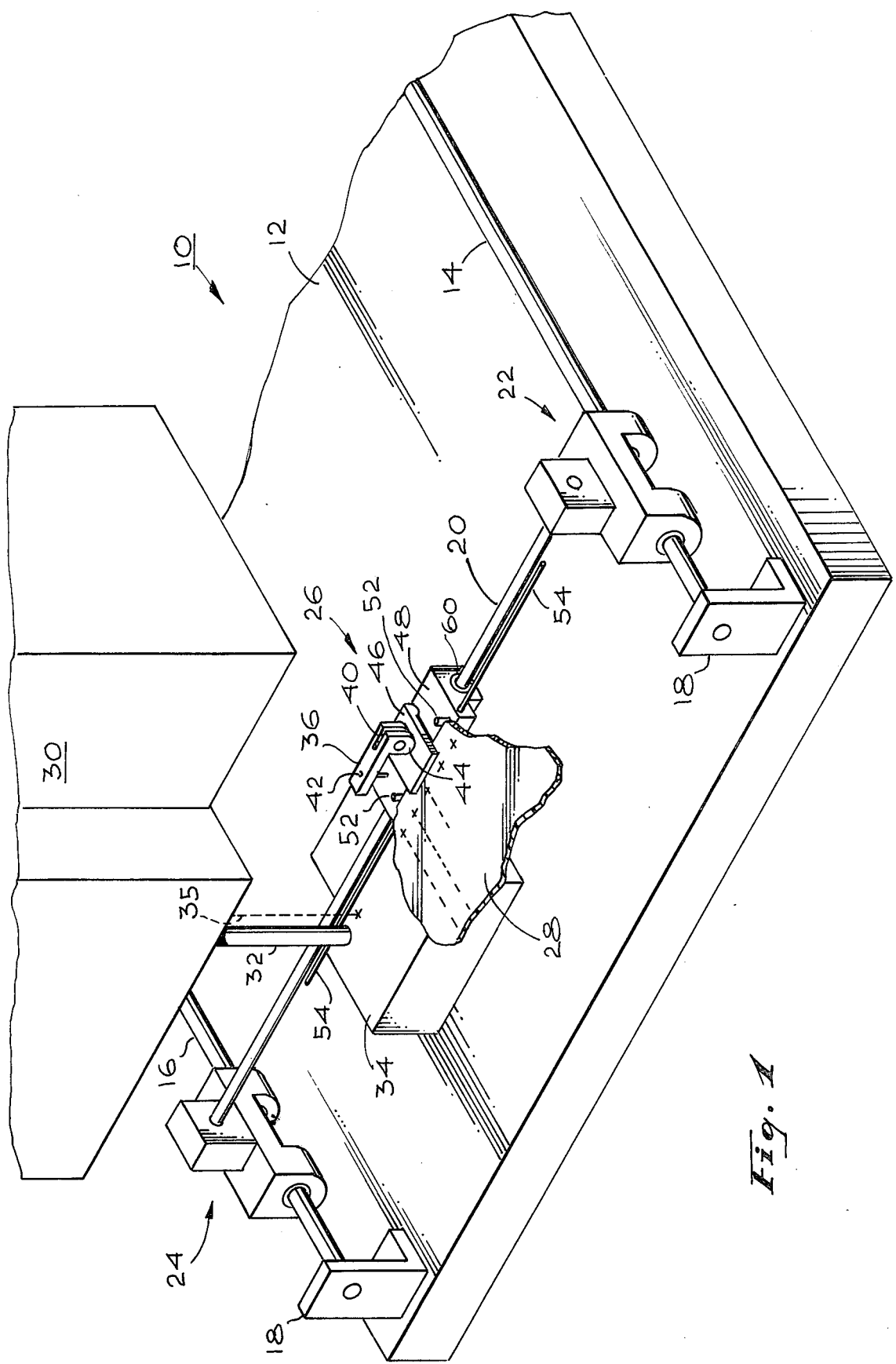
FIG. 1 is a perspective view showing a work table and the component inserting machine assembly embodying the preferred embodiment of the invention.

As seen in FIG. 1, a locating assembly 10 is positioned on table 12. Parallel guide rails 14 and 16 are fastened to the top of table 12 by retainers 18. The parallel guide rails 14, 16 extend longitudinally from the front of table 12 in the Y axis of a Cartesian coordinate system whose area of operation is parallel to, and slightly above the top of table 12. Guide rail 20 extends between, and is slidably connected to the parallel guide rails 14, 16 by guide rail slides 22 and 24. Clamp assembly 26 is slidably mounted on guide rail 20 by ball bushings 60, to be explained in greater detail below. Module board 28 is secured to clamp assembly 26, and is movable in the transverse or X direction in the Cartesian coordinate system as defined. An automatic inserting machine 30 is positioned over the work table 12 having an inserting chute 32 extending to approximately the plane in which the module board 28 is secured. An inserting machine back pressure stop 34 is placed on the work table 12 so that when the module board 28 is placed between the inserting chute 32 and stop 34, the pressure, usually air pressure, inserting the electrical component onto the module board 28 will not severely disorient the module board from its clamped orientation. The module board can be positioned or located by relation to a light beam 35, which may include crossed hair shadows.

Figure 2:
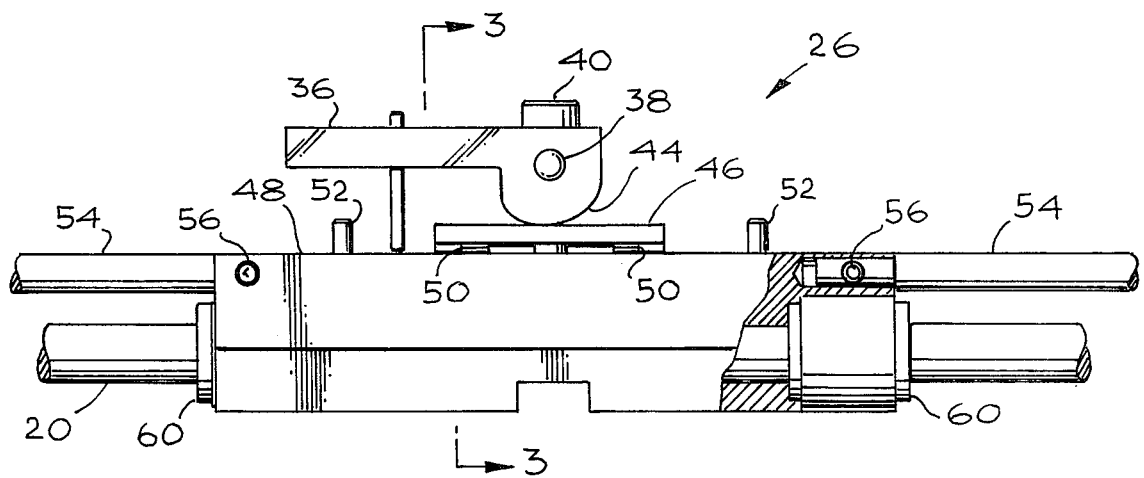
FIG. 2 is a front elevation of the clamp assembly of FIG. 1 showing detail of extension support rods and rails in partial section.
Figure 3:
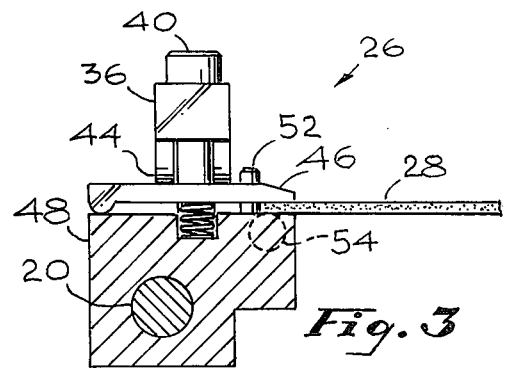
FIG. 3 is a side elevation, in partial cross section, of the clamp assembly as seen along line 3—3 of FIG. 2.

Referring more specifically to the clamp assembly 26 as seen not only in FIG. 1, but also in FIGS. 2 and 3, a cam clamp 36 rotates about pin 38 secured in clamp post 40. When the handle of the clamp 36 is rotated until stopped by pin 42, the clamp lobes 44 press downwardly on clamp plate 46. The module board 28 is secured between the clamp plate 46 and base plate 48. A biasing force on the clamp plate 46 is maintained by springs 50. The module board 28 is inserted within the space between clamp plate 46 and base plate 48 until stopped by dowel stop pins 52 placed on opposite sides of the clamp aligned along the transverse direction. The extension support rods 54 are secured within the base plate 48 by socket set screws 56. Ball bushings 60 allow the base plate 48 to ride in the transverse or X direction on guide rail 20.

Figure 4:
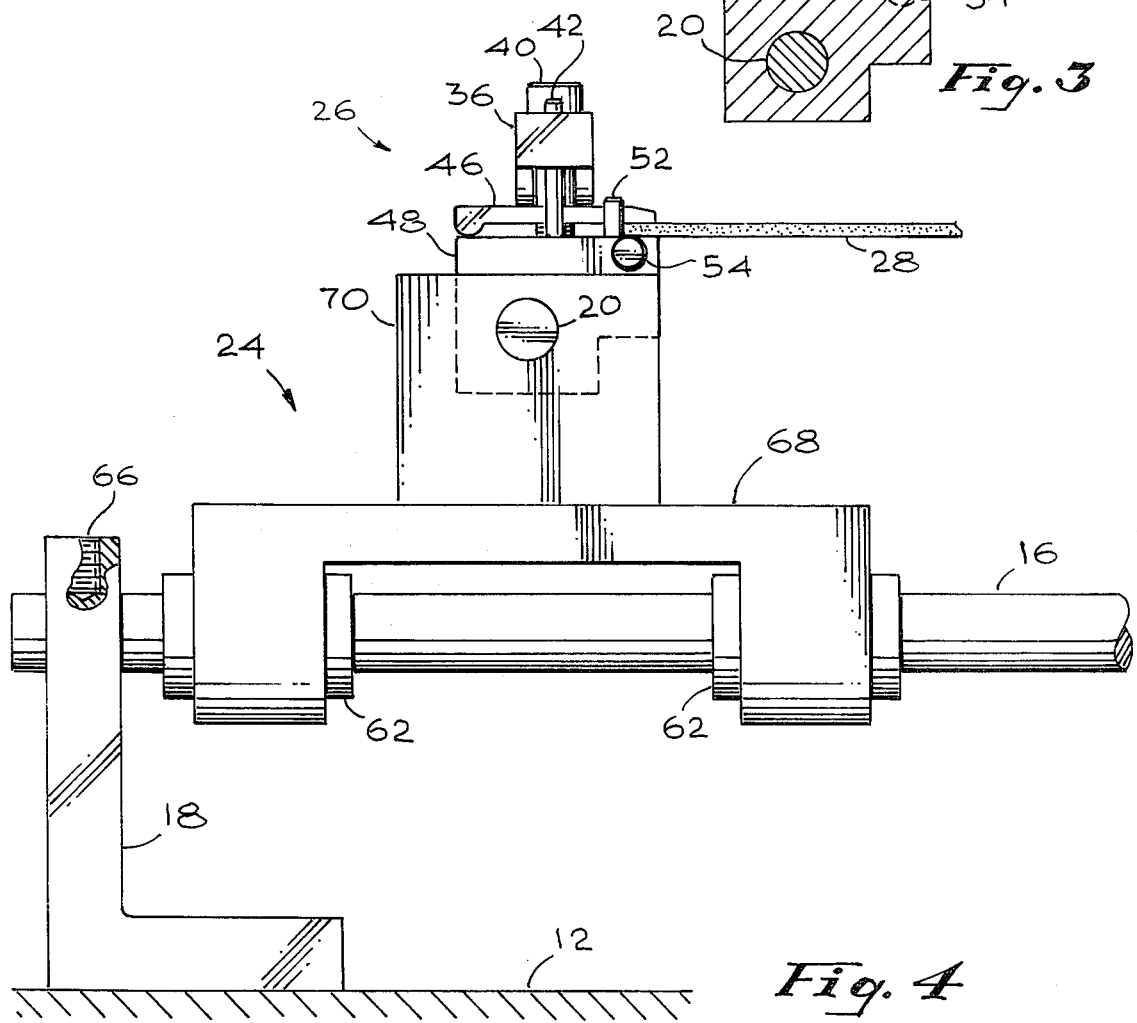
FIG. 4 is a side elevation of the clamp assembly and rail movement assembly showing partial detail in section.

In FIG. 4, ball bushing 24 is seen riding on longitudinal guide rail 16 mounted on the work table 12 by rail guide retainer 18. Socket set screw 66 provides a setting of the rail guide 16. Rail guide slide plate 68 supports the transverse rail guide retainer 70 which seats the transverse rail guide 20.

In operation, a forward edge of a module board 28 is inserted against the dowel stop pins 52 between the clamp plate 46 and the base plate 48. The clamp 36 is rotated about pin 38 until the lobes 44 depress the clamp plate 46 against the force of compression springs 50. The clamp plate 46 then tightly secures the module board 28 against the base plate 48. The clamp 36 is prevented from over-rotation by stop pin 42. The module board 28 rests upon extension support rods 54, which further serve to insure a level orientation. Because the dowel stop pins 52 are precisely aligned in the transverse direction, the module board 28 will be correctly oriented in the X-Y Cartesian coordinate system of the work table. The clamp assembly is then moved along transverse guide rail 20 to position and locate the module board 28 at the correct abscissa or X coordinate point. The module board 28 is then moved longitudinally as the transverse guide rail moves on guide rail slides 22, 24 to the correct ordinate or longitudinal position.

The location on the module board 28 into which the electrical component is to be inserted is placed directly between the back stop 34 and inserter chute 32. The assembler can precisely locate this point by virtue of a light beam 35 having crossed hairs shadows, or in any other manner which may be known or desired. When the module board 28 is thus located, the assembler can depress an actuator causing the correct electrical component to descend the chute 32 with force into the module board 28. The power thus exerted on the module board 28 is prevented from disorienting the module board relative to the clamp assembly 26 by virtue of the extension support rods 54 and by virtue of back stop 34. The insertor 30 may be programmed or otherwise arranged so that different types of electrical components can be powered down the chute 32 in a predetermined sequence. The module board 28 may be maneuvered then several times for receipt of several different electrical components while the assembler maneuvers the clamp assembly 26 after each operation or insertion.

When the module board 28 has been constructed with the various electrical components or modules as desired, the clamp 36 is rotated in the reverse direction about the pin 38 so as to release the pressure on clamp plate 46. The compressive strength of springs 50 urges the clamp plate 46 upwardly releasing pressure on the module board 28. A new module board then can be inserted between the clamp plate 46 and the base plate 48 until the leading edge abuts against the aligned back stop pins 52. The assembly process can be repeated.

Although there have been described above specific arrangements of a module board locating assembly in accordance with the invention for the purpose of illustrating the manner in which the invention may be used to advantage, it will be appreciated that the invention is not limited thereto. Accordingly, any and all modifications, variations or equivalent arrangements which may occur to those skilled in the art should be considered to be within the scope of the invention as defined in the appended claims.

What is claimed is:

1. Apparatus for locating a module board in relation to an inserting element of an electrical component inserting machine, comprising:
   a single transverse first rail slidably mounted on a pair of second rails perpendicular thereto;
   a clamp assembly for securing a module board slidably mounted on the first rail, said clamp assembly including a base plate and a releasable clamp plate for selectively gripping a portion of the module board inserted between said plates and for supporting substantially the load of the module board along a first edge thereof adjacent the gripped portion and having a cam clamp movably positioned therewith for urging the clamp plate toward the base plate; and
   a backing member positioned beneath the module board when the board is gripped in the clamp assembly, the module board cooperating with the clamp assembly, when gripped thereby, to support the clamp assembly against rotation about the single rail in the direction of the backing member;
   wherein each slidable mount is a ball bushing.

2. The apparatus of claim 1 wherein the clamp assembly further includes a compression spring biasing the clamp plate away from the base plate for releasing the module board therefrom.

3. The apparatus of claim 1 wherein the clamp assembly further includes at least two stop pins transversely aligned on said base plate for aligning the module board.

4. The apparatus of claim 1 wherein the clamp assembly further comprises a plurality of support rods extending away from the base plate for partially supporting the cantilevered load of the module board.

5. The apparatus of claim 1 wherein the backing member comprises a pressure backstop positioned opposite the module board from the inserting element for preventing disorientation of the module board during insertion.

6. The apparatus of claim 1 wherein the second rails are mounted on a work table.

7. The apparatus of claim 1 further comprising indexing means for projecting a crossed hairs shadow on the module board at a fixed position for visually locating the module board in relation to the inserting machine.

* * * * *